(12) United States Patent  
Kwak

(10) Patent No.: US 9,129,709 B2  
(45) Date of Patent: Sep. 8, 2015

(54) MEMORY SYSTEM COMPRISING NON-VOLATILE MEMORY DEVICE AND RELATED METHOD OF OPERATION

(75) Inventor: Dong-Hun Kwak, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 451 days.

(21) Appl. No.: 13/547,441

(22) Filed: Jul. 12, 2012

(65) Prior Publication Data

US 2013/0088928 A1  Apr. 11, 2013

(30) Foreign Application Priority Data

Oct. 5, 2011  (KR) .......................... 10-2011-0101037

(51) Int. Cl.
| | | |
|---|---|---|
| G11C 7/10 | (2006.01) | |
| G11C 11/56 | (2006.01) | |
| G11C 16/34 | (2006.01) | |
| G11C 16/06 | (2006.01) | |
| G11C 16/26 | (2006.01) | |
| G11C 16/10 | (2006.01) | |
| G11C 16/04 | (2006.01) | |

(52) U.S. Cl.
CPC .............. *G11C 11/5642* (2013.01); *G11C 7/10* (2013.01); *G11C 11/5628* (2013.01); *G11C 16/34* (2013.01); *G11C 16/0483* (2013.01); *G11C 16/06* (2013.01); *G11C 16/10* (2013.01); *G11C 16/26* (2013.01); *G11C 2211/5641* (2013.01); *G11C 2211/5646* (2013.01)

(58) Field of Classification Search
CPC ........ G11C 16/34; G11C 16/06; G11C 16/10; G11C 16/26; G11C 7/10
USPC ........... 365/189.05, 189.08, 189.011, 185.03, 365/185.24
See application file for complete search history.

(56) References Cited

U.S. PATENT DOCUMENTS

| | | | |
|---|---|---|---|
| 7,508,715 B2 | 3/2009 | Lee | |
| 7,599,224 B2 | 10/2009 | Lee | |
| 7,916,534 B2 | 3/2011 | Shimizu et al. | |
| 8,526,245 B2 * | 9/2013 | Yoon et al. ............... | 365/189.16 |
| 2010/0061151 A1 | 3/2010 | Miwa et al. | |
| 2010/0284222 A1 | 11/2010 | Jang | |
| 2011/0141811 A1 | 6/2011 | Shimizu et al. | |
| 2011/0222342 A1 * | 9/2011 | Yoon et al. ............... | 365/185.03 |
| 2011/0249496 A1 * | 10/2011 | Son et al. ................. | 365/185.03 |
| 2012/0290897 A1 * | 11/2012 | Yoon et al. ............... | 714/766 |

FOREIGN PATENT DOCUMENTS

JP   2007-305210   11/2007

* cited by examiner

*Primary Examiner* — Toan Le  
(74) *Attorney, Agent, or Firm* — Volentine & Whitt, PLLC

(57) ABSTRACT

A nonvolatile memory device includes a first memory region and a second memory region. The nonvolatile memory device is programmed by storing program data in the first memory region, performing coarse programming and fine programming to store the program data in the second memory region, and in response to a read request, accessing the program data from the first memory region or the second memory region according to a fine program flag indicating whether the coarse programming has been completed.

18 Claims, 17 Drawing Sheets

MEMORY SYSTEM COMPRISING NON-VOLATILE MEMORY DEVICE AND RELATED METHOD OF OPERATION

CROSS-REFERENCE TO RELATED APPLICATIONS

This application claims priority under 35 U.S.C §119 to Korean Patent Application No. 10-2011-0101037 filed on Oct. 5, 2011, the disclosure of which is hereby incorporated by reference in its entirety.

BACKGROUND OF THE INVENTION

The inventive concept relates generally to electronic memory technologies. More particularly, the inventive concept relates to a memory system incorporating a nonvolatile memory device and a related method of operation.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include static random access memory (SRAM) and dynamic random access memory (DRAM). Examples of nonvolatile memory devices include Mask Read-Only Memory (MROM), Programmable ROM (PROM), Erasable Programmable ROM (EPROM), and Electrically Erasable Programmable ROM (EEPROM).

Flash memory is an especially popular form of EEPROM. Flash memory devices are currently found in a wide variety of devices such as computers, cellular phones, personal digital assistants (PDAs), digital cameras, camcorders, voice recorders, personal media players, handheld personal computers (PCs), gaming machines, facsimile machines, scanners, printers, and so on.

In an effort to provide increased storage capacity, researchers have developed flash memory devices capable of storing multiple bits of data in each memory cell. Such devices are commonly referred to as multi-level-cell (MLC) flash memory devices. One drawback of MLC flash memory devices is that they typically have very strict operating margins. For example, their threshold voltage distributions must be controlled with a high level of accuracy in order to avoid errors. Consequently, researchers are continually seeking ways to improve the accuracy and reliability of MLC flash memory devices.

SUMMARY OF THE INVENTION

In an embodiment of the inventive concept, a memory system, comprises a nonvolatile memory device comprising a memory cell array having a first memory region and a second memory region, and a memory controller configured to control the nonvolatile memory device to store data in the first region while programming the data in the second memory region using a coarse program operation and a fine program operation, and further configured to control the nonvolatile memory device in response to a read request to read the data from the first memory region or the second memory region based on a fine program flag indicating whether the fine program operation is completed.

In another embodiment of the inventive concept, a method is provided for operating a nonvolatile memory device comprising a first memory region and a second memory region and configured to write data in the second memory region using a coarse program operation and a fine program operation. The method comprises receiving a read request, reading a fine program flag indicating whether fine programming has been completed in the second region with respect to read data corresponding to the read request, and accessing read data from either the first memory region or the second memory region according to the fine program flag.

In another embodiment of the inventive concept, a method is provided for operating a nonvolatile memory device comprising a first memory region and a second memory region. The method comprises storing program data in the first memory region, performing coarse programming and fine programming to store the program data in the second memory region, and in response to a read request, accessing the program data from the first memory region or the second memory region according to a fine program flag indicating whether the coarse programming has been completed.

These and other embodiments of the inventive concept can potentially improve the performance and reliability of nonvolatile memory devices by allowing data to be reliably read during the performance of program operations using an address scramble method.

BRIEF DESCRIPTION OF THE DRAWINGS

The drawings illustrate selected embodiments of the inventive concept. In the drawings, like reference numbers indicate like features. In addition, the size and relative sizes of layers, regions, or other features may be exaggerated for clarity.

DETAILED DESCRIPTION

Figure 1:
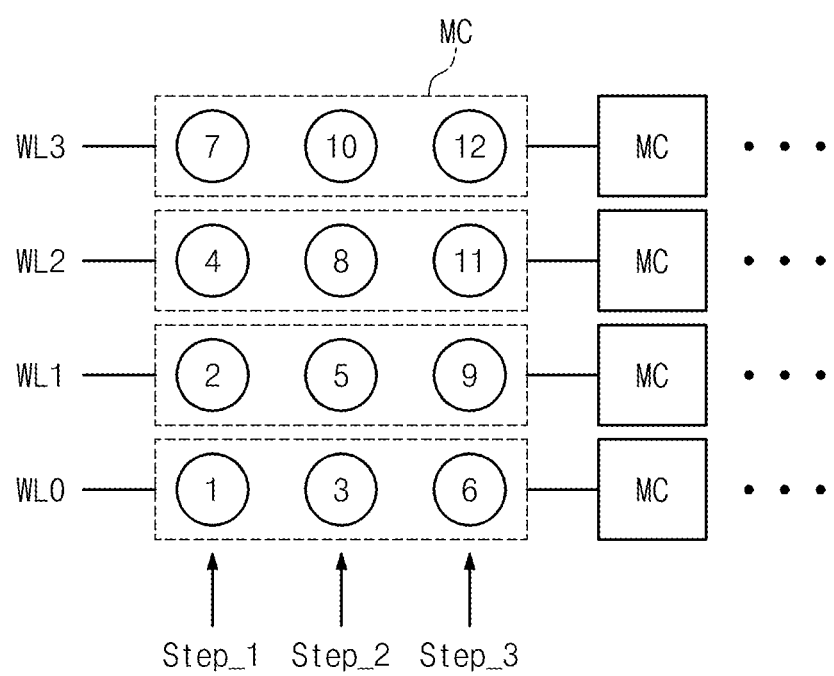
FIG. 1 is a diagram illustrating an address scramble method applied to an MLC flash memory device according to an embodiment of the inventive concept.

The inventive concept is described more fully hereinafter with reference to the accompanying drawings, in which embodiments of the inventive concept are shown. The inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art.

It will be understood that, although the terms first, second, third, etc., may be used to describe various elements, components, regions, layers and/or sections, these elements, components, regions, layers and/or sections should not be limited by these terms. Rather, these terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises," "comprising," "includes," "including," "having,", or the like, where used in this specification, indicate the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that where an element or layer is referred to as being "on", "connected to", "coupled to", or "adjacent to" another element or layer, it can be directly on, connected, coupled, or adjacent to the other element or layer, or intervening elements or layers may be present. In contrast, where an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms such as those defined in commonly used dictionaries should be interpreted as having a meaning that is consistent with their meaning in the context of the relevant art and/or the present specification and will not be interpreted in an idealized or overly formal sense unless expressly so defined herein.

FIG. 1 is a diagram illustrating an address scramble method applied to an MLC flash memory device according to an embodiment of the inventive concept. This method can be used to improve the reliability of the MLC flash memory device.

In general, the reliability of a flash memory device tends to decrease as the number of bits stored in each memory cell increases. One potential cause of this decrease in reliability is a variation in threshold voltages due to coupling between adjacent memory cells. For example, a threshold voltage of a previously programmed memory cell may be varied due to the coupling caused when an adjacent memory cell is programmed. An address scramble method may be applied to the MLC flash memory device to manage such coupling.

The address scramble method of FIG. 1 will be described in relation to an MLC flash memory device that stores 3-bit data in each memory cell. Moreover, for ease of illustration, FIG. 1 shows four word lines WL0 to WL3, with a plurality of memory cells MC connected to each word line. The number and arrangement of particular features, however, may vary in other embodiments.

Referring to FIG. 1, the address scramble method comprises various steps labeled Step_1, Step_2, and Step_3. In a first step program operation, labeled Step_1, lower 2-bit data is stored in each memory cell connected to a first word line WL0. This is labeled as operation ① in FIG. 1. Thereafter, a first step program operation is performed with respect to memory cells connected with a second word line WL1. This is labeled as operation ② in FIG. 1.

After the first step program operation is performed with respect to memory cells connected with second word line WL1, a second step program operation, labeled Step_2, is performed with respect to first word line WL0 to store upper 1-bit data in memory cells that have been previously programmed with lower 2-bit data in operation ①. This second step program operation is labeled operation ③ in FIG. 1. Following the second step program operation of first word line WL0, a first step program operation is performed with respect to a third word line WL2. This is labeled as operation ④ in FIG. 1.

After the first step program operation of third word line WL2, a second step program operation is performed with respect to second word line WL1 to store upper 1-bit data in memory cells that have been previously programmed with lower 2-bit data in operation ②. This second step program operation is labeled operation ⑤ in FIG. 1.

After the second step program operation is performed with respect to memory cells connected with second word line WL1, a third step program operation, labeled Step_3, is performed on memory cells connected with first word line WL0. This is marked by ⑥ in FIG. 1. Afterwards, remaining first through third step program operations may be performed sequentially according to the order illustrated in FIG. 1. A method of selecting word lines according to the program order described in FIG. 1 may be referred to as an address scramble method. However, the address scramble method is not limited to the particular order shown in FIG. 1.

Upon completion of the first step program operation and the second step program operation, threshold voltage distributions (e.g., $2^N$ threshold voltage distributions) respectively corresponding to N-bit data (N>1) are all formed. Although all threshold voltage distributions are formed upon completion of the second step program operation, margins between threshold voltage distributions may be insufficient to reliably distinguish threshold voltage distributions.

The third step program operation is performed to produce margins sufficient to reliably distinguish threshold voltage distributions. The third step program operation narrows a width of each threshold voltage distribution. During the third step program operation, verification voltages are used which are higher by a predetermined voltage than verification voltages of threshold voltage distributions used at the second step program operation. This technique, which is referred to as a reprogramming method/algorithm, can reduce coupling between adjacent memory cells. Although FIG. 1 illustrates the reprogramming method with respect to memory cells storing 3-bit data, it can also be applied to memory cells storing 2-bit data or 4-bit data, for example.

In the reprogramming method, it may be necessary for a memory controller or other component to retain data stored in memory cells connected to a selected word line until a fine program operation (e.g., third step program operation Step_3) has been performed. For example, under some circumstances, the first step program operation may be performed based on data provided from the memory controller, the second step program operation may be performed according to data stored by the first step program operation and additional data provided from the memory controller, and the third step program operation may be performed according to data stored by the first step and second step program operations. However, as described above, it may be difficult to reliably read data stored through the first step and second step program operations. Consequently, data for the third step program operation may be provided to the multi-bit memory device from the memory controller. In other words, the memory controller may be required to retain data stored in the memory cells connected to the selected word line until the fine program operation has been completed. To allow this data storage, the memory controller comprises a large buffer memory to retain data needed for the third step program operation.

Figure 2:
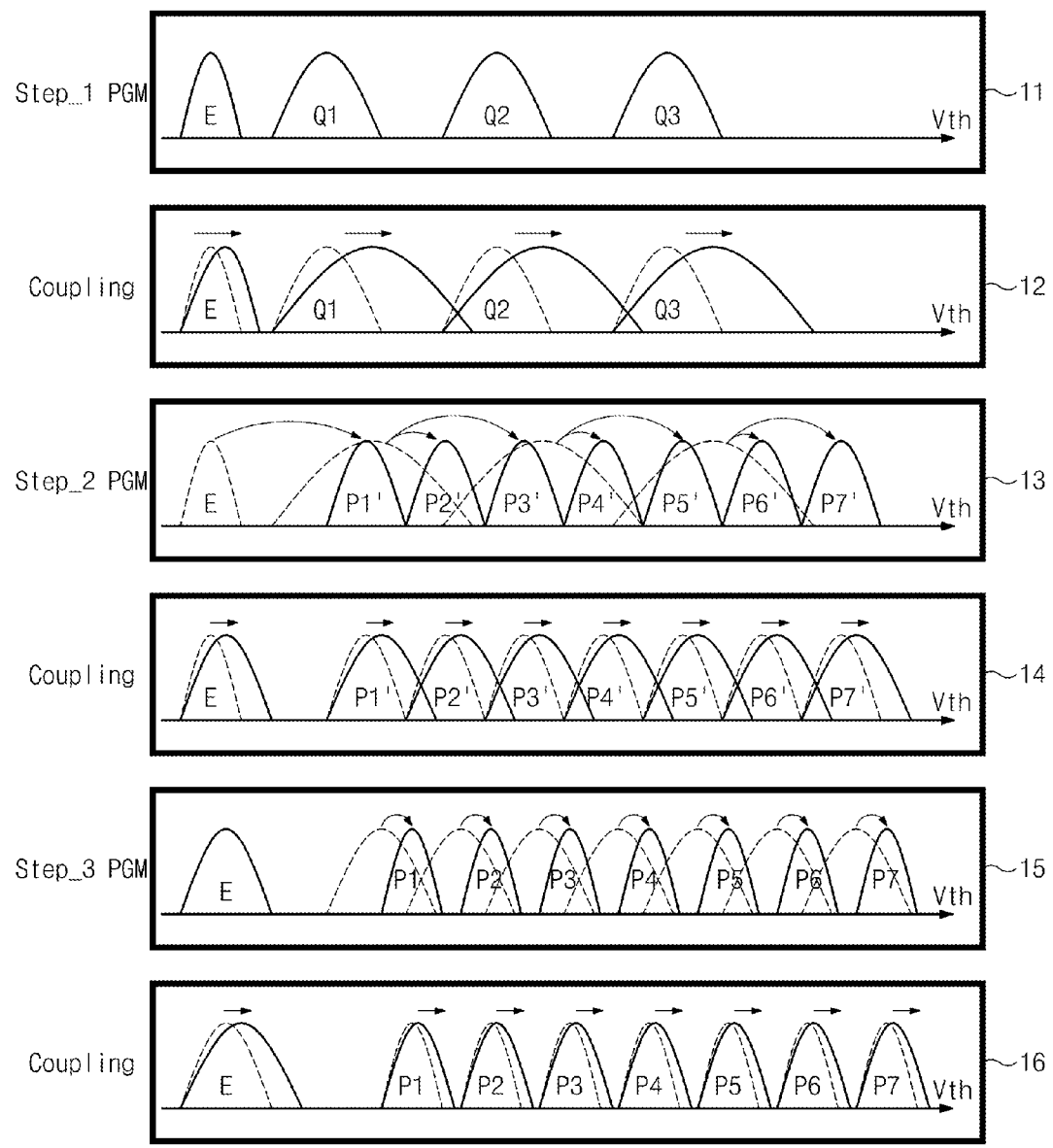
FIG. 2 is a diagram showing variations of threshold voltage distributions where a program operation is performed according to 3-step programming to store 3-bit data in each memory cell.

FIG. 2 is a diagram showing variations of threshold voltage distributions where a program operation is performed according to 3-step programming to store 3-bit data in each memory cell.

First, 2-page data (i.e., first and second page data) is stored in memory cells of a selected word line (e.g., WL0 in FIG. 1). As illustrated in a box 11 of FIG. 2, memory cells in a threshold voltage distribution corresponding to an erase state E are programmed to have threshold voltages in threshold voltage distributions each corresponding to program states Q1, Q2, and Q3, based on data to be programmed.

As described above, a second step program operation of 1-step programmed memory cells in a selected word line WL0 is executed after a first step program operation of memory cells in an adjacent word line WL1. As illustrated in a box 12 of FIG. 2, distributions of 1-step programmed memory cells in word line WL0 may widen due to the coupling caused by the programming of memory cells of the adjacent word line WL1.

Next, 1-page data (i.e., third page data) is stored in memory cells of the selected word line WL0. As illustrated in a box 13 of FIG. 2, memory cells in a threshold voltage distribution corresponding to each state are programmed to have threshold voltages in corresponding threshold voltage distributions. For example, memory cells in a threshold voltage distribution corresponding to an erase state E are programmed to have threshold voltages in threshold voltage distributions corresponding to a program state P1', based on data to be programmed. Memory cells in threshold voltage distributions corresponding to a program state Q1 are programmed to have threshold voltages in threshold voltage distributions respectively corresponding to program states P2' and P3', based on data to be programmed. Memory cells in a threshold voltage distribution corresponding to a program state Q2 are programmed to have threshold voltages in corresponding threshold voltage distributions to program states P4' and P5', based on data to be programmed. Memory cells in a threshold voltage distribution corresponding to a program state Q3 are programmed to have threshold voltages in corresponding threshold voltage distributions to program states P6' and P7', based on data to be programmed.

As described above, a third step program operation of 2-step programmed memory cells of a selected word line WL0 are executed after a first step program operation and a second step program operation on adjacent word lines (e.g., WL2 and WL1). As illustrated by a box 14 of FIG. 2, distributions of 2-step programmed memory cells in word line WL0 may widen due to coupling caused when memory cells in the adjacent word lines WL2 and WL1 are programmed. For this reason, it is difficult to reliably read data from 2-step programmed memory cells.

Memory cells in word line WL0 are programmed to have final threshold voltage distributions P1 to P7 as illustrated in a box 15 of FIG. 2. This operation is a third step program operation. As described above, the third step program operation may require access to previously programmed data (e.g., first to third page data). Because it is difficult to read previously programmed data from memory cells in word line WL0, the third step program operation will be performed based on data provided from a memory controller (or, data maintained by a memory device).

As illustrated in a box 16 of FIG. 2, distributions of 3-step programmed memory cells may widen due to the coupling caused when memory cells in adjacent word lines are programmed. Afterwards, a first step program operation, a second step program operation, and a third step program operation on each word line are performed according to a program order (or, sequence) described in FIG. 1, which will be executed in the same manner as described in FIG. 2.

The first step and second step programming can be referred to as "coarse programming", which may be susceptible to problems associated with distribution expansion. On the other hand, the third step programming may be referred to "fine programming", which is executed to manage a distribution of memory cells with greater precision. Program voltages (e.g., an increment ΔV) and verification voltages used in the coarse programming and the fine programming step may be different.

Figure 3:
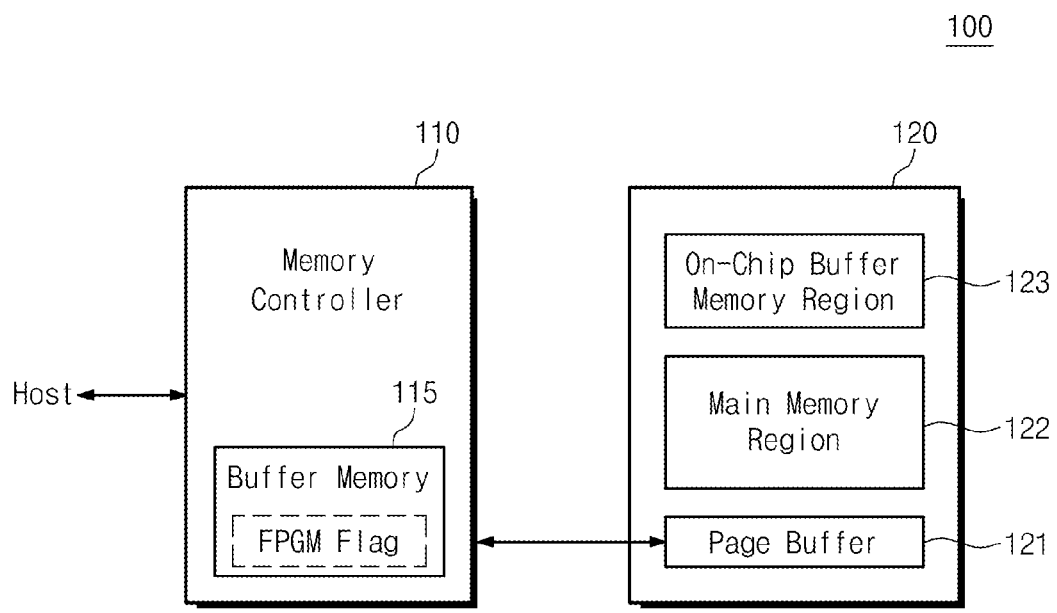
FIG. 3 is a block diagram of a memory system according to an embodiment of the inventive concept.

FIG. 3 is a block diagram of a memory system 100 according to an embodiment of the inventive concept.

Referring to FIG. 3, a memory system comprises a memory controller 110 and a nonvolatile memory device. Memory controller 110 is configured to control nonvolatile memory device 120 in response to a request of a host. Memory controller 110 comprises a buffer memory 115, which is used to temporarily store data sent from the host and data read out from nonvolatile memory device 120.

Buffer memory 115 stores program state information of a main memory region 122 of nonvolatile memory device 120. In detail, buffer memory 115 stores a fine program flag FPGM. Fine program flag FPGM indicates whether an overall program operation of corresponding memory cells is completed. Thus, if fine program flag FPGM is set, there may be no need for retaining data to be written in corresponding memory cells using another memory region. In response to a read request from the host, memory controller 110 accesses an on-chip buffer memory region 123 or main memory region 122 based on fine program flag FPGM.

Memory controller 110 controls a program operation of memory device 120 using static scheduling. For example, where data of the minimum program unit for on-chip buffer memory region 123 is stored in buffer memory 115, memory controller 110 controls nonvolatile memory device 120 such that data of the minimum program unit is stored (or, programmed) in on-chip buffer memory region 123. This may be referred to as a buffer program operation.

The buffer program operation may be performed according to address information associated with data stored in buffer memory 115. If data of the minimum program unit for main memory region 122 is gathered at on-chip buffer memory region 123, memory controller 110 controls nonvolatile memory device 120 such that data of the minimum program unit for main memory region 122 is stored (or, programmed) in main memory region 122. This is referred to as a main program operation.

The main program operation is performed according to address information associated with data stored in on-chip buffer memory region 123. The buffer and main program operations are described in further detail below. A minimum program unit for on-chip buffer memory region 123 and a minimum program unit for main memory region 122 can be determined variously according to a program technique, a cell-per-bit number, or other factors. The minimum program unit for on-chip buffer memory region 123 may be different from the minimum program unit for main memory region 122.

It is possible to reduce a size of buffer memory 115 of memory controller 110 by storing data in on-chip buffer memory region 123 through the buffer program operation and storing data in main memory region 122 through the main program operation. In other words, it is not necessary to retain data for a third step program operation in buffer memory 115. Accordingly, a size of buffer memory 115 of memory controller 110 may be reduced.

Nonvolatile memory device 120 can be formed of one or more memory devices. Moreover, nonvolatile memory device 120 and memory controller 110 may constitute a memory card, a Solid State Drive (SSD), a memory stick, or any of various other types of memory devices. Nonvolatile memory device 120 may comprise a plurality of memory blocks each comprising memory cells arranged in rows and columns. Each of the memory cells may store multi-bit (or, multi-level) data. The memory cells can be arranged to have the two-dimensional array structure or the three-dimensional/vertical array structure.

In certain embodiments, memory blocks of nonvolatile memory device 120 can be divided at least into on-chip buffer memory region 123 and main memory region 122. These divisions of memory regions 122 and 123 are made logically, not physically, and they can be changed logically as well.

Memory blocks in on-chip buffer memory region 123 are typically programmed in a manner different from memory blocks in main memory region 122. For example, memory blocks in on-chip buffer memory region 123 can be programmed by a single-bit programming method (hereinafter, referred to as a single level cell (SLC) programming method), and memory blocks in main memory region 122 may be programmed according to a multi-bit programming method (hereinafter, referred to as an MLC programming method).

Alternatively, memory blocks in the on-chip buffer and main memory regions 123 and 122 may be programmed according to the MLC programming method. For example, memory blocks in main memory region 122 may be programmed according to the above-described N-step programming method. In other words, each memory cell in on-chip buffer memory region 123 may store 1-bit data, while each memory cell in main memory region 122 may store N-bit data (N being an integer of 3 or more). As a result, data bits stored in each memory cell in on-chip memory region 123 may be less in number than N-bit data stored in each memory cell in main memory region 122.

The number of memory blocks in on-chip buffer memory region 123 may be varied according to the number of data bits stored in each memory cell of main memory region 122. For example, where memory cells in main memory region 122 store N-bit data, on-chip buffer memory region 123 comprises at least N memory blocks. N-bit data to be stored in memory cells of main memory region 122 may be stored in memory blocks of on-chip buffer memory region 123, respectively.

For explanation purposes, it is assumed that 3-bit data is stored in each memory cell of main memory region 122. In this case, on-chip buffer memory region 123 comprises at least three memory blocks. Least significant bit (LSB) data bits (i.e., first bits) of memory cells in main memory region 122 are stored in a first memory block of on-chip buffer memory region 123. Intermediate data bits (i.e., second bits) of memory cells in main memory region 122 are stored in a second memory block of on-chip buffer memory region 123. Most significant bit (MSB) data bits (i.e., third bits) of memory cells in main memory region 122 are stored in a third memory block of on-chip buffer memory region 123. These operations will be described in further detail below.

In accordance with the above description, memory controller 110 stores a fine program flag FPGM indicating whether fine programming of memory cells of each word line unit has been performed. In response to a read request, memory controller 110 accesses on-chip buffer memory region 123 or main memory region 122 based on whether fine programming of a read-requested memory region is executed. Once an overall program operation of the read-requested memory region is completed, memory controller 110 controls nonvolatile memory device 120 to output data from memory cells connected with a selected word line of main memory region 122. Where an overall program operation on the read-requested memory region is not completed, memory controller 110 controls nonvolatile memory device 120 to output read-requested data from on-chip buffer memory region 123.

Figure 4:
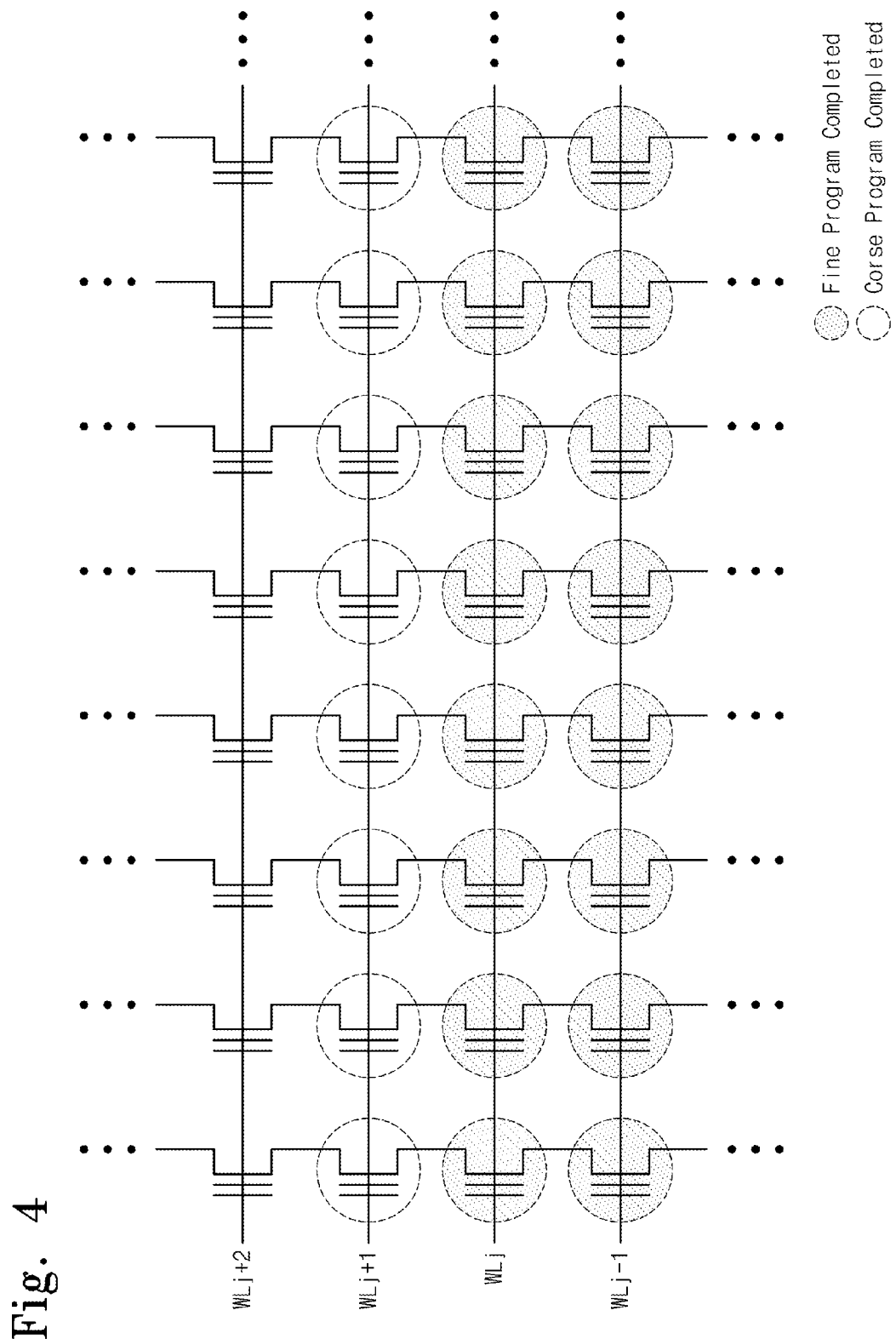
FIG. 4 is a diagram illustrating a main memory region of FIG. 3 according to an embodiment of the inventive concept.

FIG. 4 is a diagram illustrating a main memory region of FIG. 3 according to an embodiment of the inventive concept. In the example of FIG. 4, certain memory cells are labeled as having been fine programmed, and other memory cells are labeled as having been coarse programmed.

After coarse programming of memory cells connected to a word line WLj, coarse programming is performed on memory cells connected to a following word line WLj+1. Next, fine programming is performed on word line WLj. Thereafter, a fine program flag FPGM is stored for memory cells connected to word line WLj. Thus, if a fine program flag FPGM is stored for memory cells connected to a word line WLj, for example, fine programming of word lines WL0 to WLj−1 located below word line WLj is deemed to be completed.

Figure 5A:
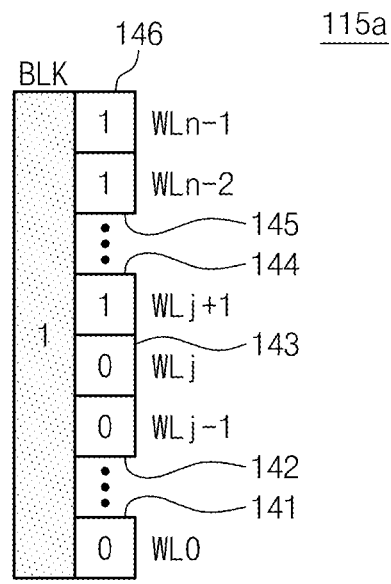
FIGS. 5A and 5B are diagrams illustrating examples of a fine program flag according to embodiments of the inventive concept.
Figure 5B:
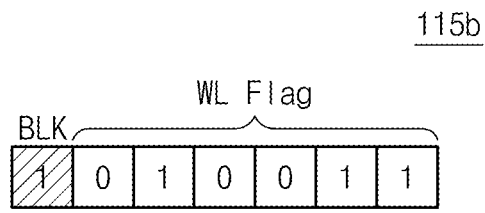

FIGS. 5A and 5B are diagrams illustrating examples of a fine program flag according to embodiments of the inventive concept.

Referring to FIG. 5A, fine program flags FPGM of a memory block and word lines (or, word line units of memory cells) in the memory block may be provided as a table. In FIG. 4, fine programming has not been performed for all memory cells in a memory block, which corresponds to a state of non-completion. In other words, in the memory block, fine programming has not been performed on memory cells of word lines being programmed following at least one word line WLj+1. Thus, a fine program flag FPGM of memory block BLK is set to logical '1'. Once fine programming on all memory cells of memory block BLK is completed, a fine program flag FPGM of memory block BLK is switched to logical '0'.

Fine program flag bits of memory cells connected to word line WLj+1 are as illustrated in FIG. 5A. Memory cells connected to word lines WL0 to WLj have a fine program completed state. Thus, fine program flags on word lines WL0 to WLj are set to logical '0'.

On the other hand, logical '1' of a fine program flag indicates that fine programming has not been performed. Where memory cells selected in a read operation are memory cells connected to word line WLj+1, an on-chip buffer memory region 123 is accessed.

Referring to FIG. 5B, fine program flags of a memory block and word line units of memory cells in the memory block may be provide as a code. It is assumed that a word line WLj associated with fine program completed memory cells is a 20-th word line, or word line WL19. A code value corresponding to location information WL flag of the uppermost word line of fine program completed memory cells may be encoded to '010011'. Further, because fine programming on all memory cells in a memory block BLK is not completed, a fine program flag FPGM on memory block BLK is set to logical '1'. Once fine programming on all memory cells in memory block BLK is completed, a fine program flag FPGM of memory block BLK is switched to logical '0'.

Figure 6:
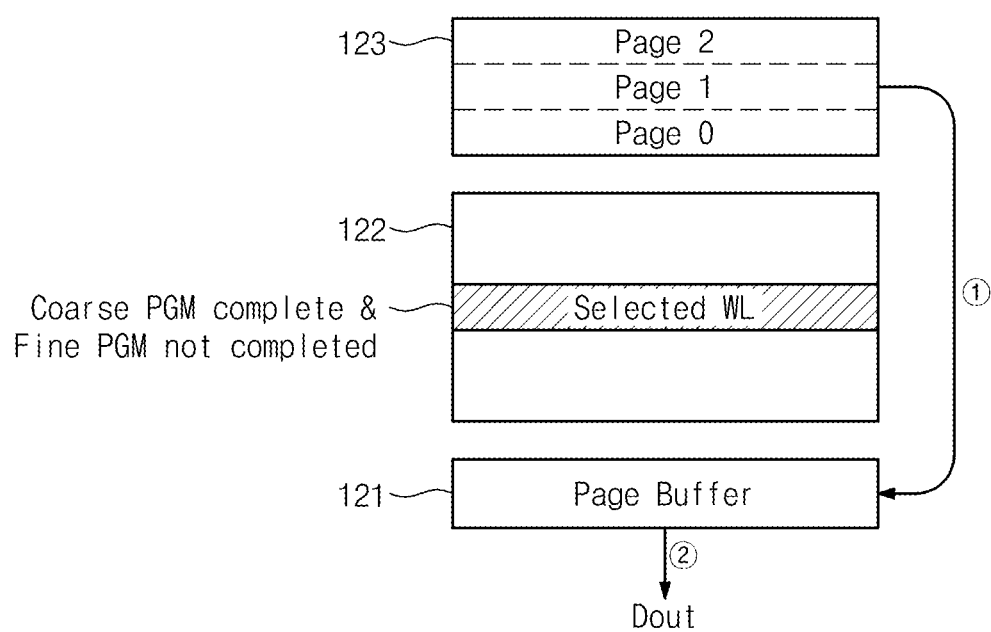
FIG. 6 is a diagram illustrating a read method according to an embodiment of the inventive concept.

FIG. 6 is a diagram illustrating a read method according to an embodiment of the inventive concept. For convenience, the method of FIG. 6 will be described with reference to memory system 100 of FIG. 3.

Referring to FIG. 6, in response to a read request, memory controller 110 compares a selected memory region and a fine program flag FPGM stored in a table. If an overall program operation of a read requested memory region is determined to be completed, memory controller 110 accesses main memory region 122. On the other hand, if an overall program operation of a read requested memory region is determined not to be completed, memory controller 110 accesses an on-chip buffer memory region 123. Memory controller 110 controls page buffer 121 so as to access on-chip buffer memory region 123 and to read data of one or more pages stored by buffer programming. This data output path is illustrated by arrows in FIG. 6 labeled ① and ②.

Figure 7:
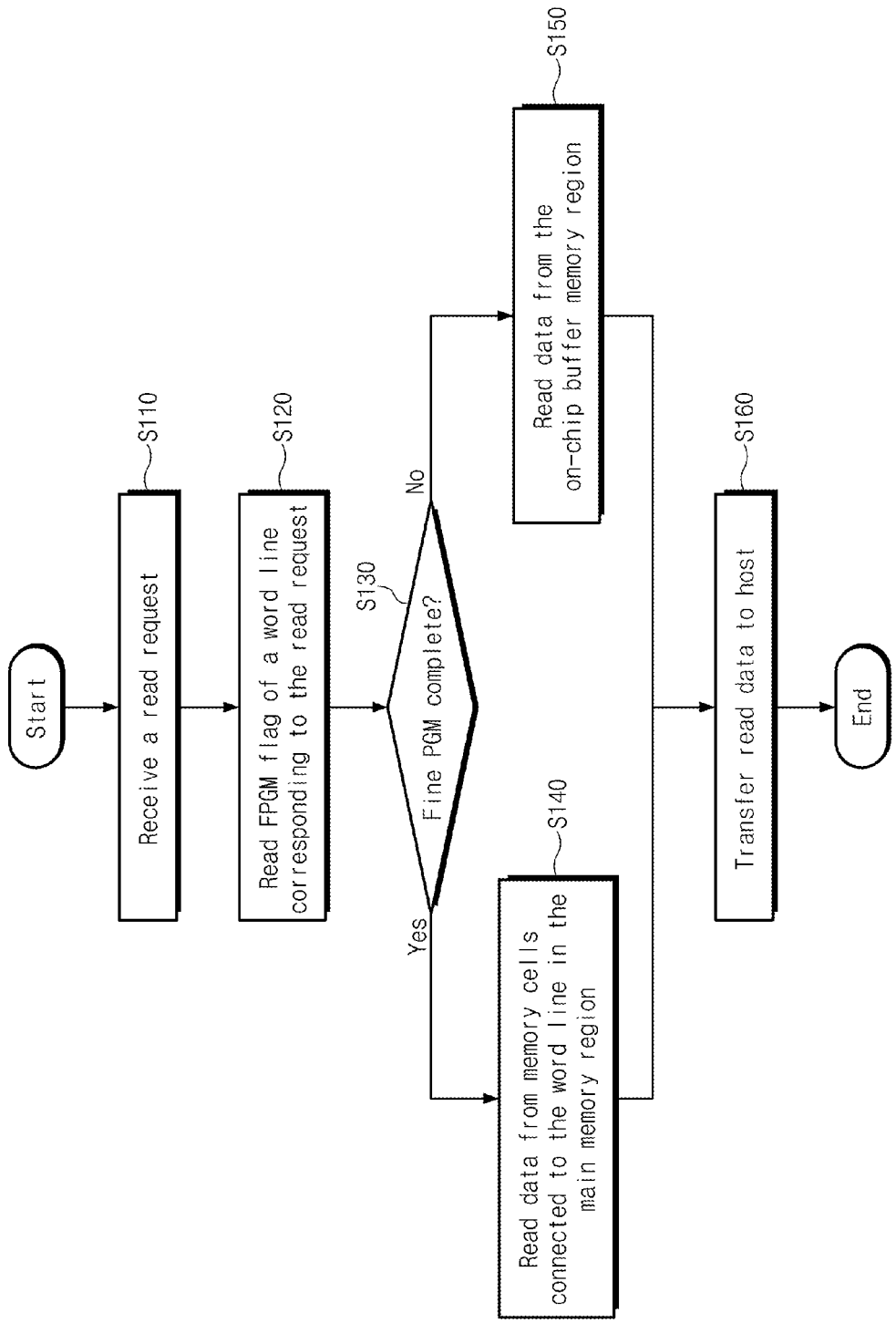
FIG. 7 is a flowchart illustrating a read method according to an embodiment of the inventive concept.

FIG. 7 is a flowchart illustrating a read method according to an embodiment of the inventive concept. The read method comprises operations S110 through S160 and it is described with reference to memory system 100 of FIG. 3 for the sake of convenience.

In operation S110, memory controller 110 receives a read request from an external source such as a host. The read request typically comprises address information of stored data.

In operation S120, memory controller 110 detects a fine program flag corresponding to the read request. Memory controller 110 detects a fine program flag stored in buffer memory 115 based on address information provided at the read request. The fine program flag is typically stored in the form of a table or code.

In operation S130, memory controller 110 determines whether a fine program operation of each word line is completed, based on address mapping information. Where the read requested data is determined to be associated with a fine programming completed word line (S130=Yes), the method proceeds to operation S140. Otherwise, where the read requested is determined not to be associated with a fine programming completed word line (S130=No), the method proceeds to operation S150.

In operation S140, memory controller 110 controls nonvolatile memory device 120 such that read requested data is read out from main memory region 122. A read operation of main memory region 122 may be an MLC read operation. Data read out from main memory region 122 is temporarily stored in a buffer memory 115 of memory controller 110. Thereafter, the method proceeds to operation S160.

In operation S150, if the read requested is determined not to be associated with a fine programming completed word line, memory controller 110 controls nonvolatile memory device 120 such that read requested data is read out from an on-chip buffer memory region 123. A read operation of on-chip buffer memory region 123 may be an SLC read operation. Data read out from on-chip buffer memory region 123 is temporarily stored in buffer memory 115 of memory controller 110. Thereafter, the method proceeds to operation S160 in which read data stored in buffer memory 115 is sent to the host.

By the above method, it is possible to prevent data from being read from a data region where fine programming is not completed using fine program flag FPGM. That is, because data retained via buffer programming is provided, it is possible to realize a memory system providing high-reliability data.

Figure 8:
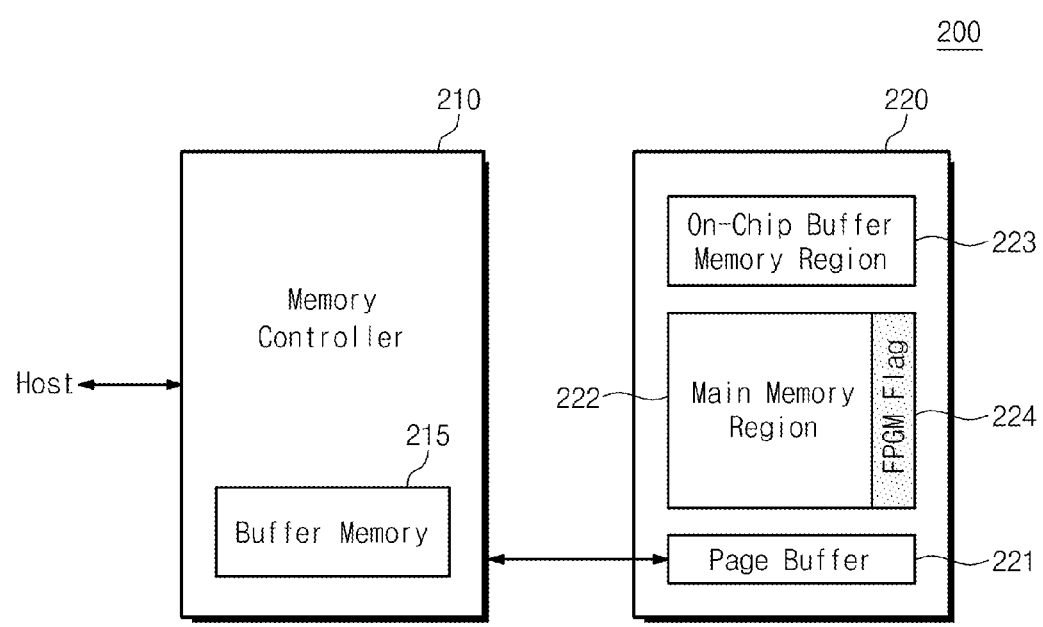
FIG. 8 is a block diagram illustrating a memory system according to an embodiment of the inventive concept.

FIG. 8 is a block diagram illustrating a memory system 200 according to an embodiment of the inventive concept.

Referring to FIG. 8, a memory system comprises a memory controller 210 and a nonvolatile memory device 220. A fine program flag FPGM is stored in a specific area 224 of a main memory region 222 of nonvolatile memory device 220.

Memory controller 210 is configured to control nonvolatile memory device 220 in response to a request from a host. Memory controller 210 comprises a buffer memory 215. However, a fine program flag FPGM may alternatively be retained in nonvolatile memory device 220 rather than buffer memory 215. In a program operation, memory controller 210 writes whether fine programming on word line units of memory cells is executed, in specific area 224 of main memory region 222. For example, specific area 224 may be a spare area in which control information on word line units of memory cells is stored. Specific area 224 can be implemented using a separate memory region.

In response to a read request, memory controller 210 reads a fine program flag FPGM of an address corresponding to the read request from specific area 224. Memory controller 210 determines whether fine programming of a read requested memory region is executed, based on the read fine program flag FPGM. Where fine programming of a read requested memory region is not executed, memory controller 210 accesses an on-chip buffer memory region 223. Where fine programming on a read requested memory region is executed, memory controller 210 accesses main memory region 222.

Figure 9:
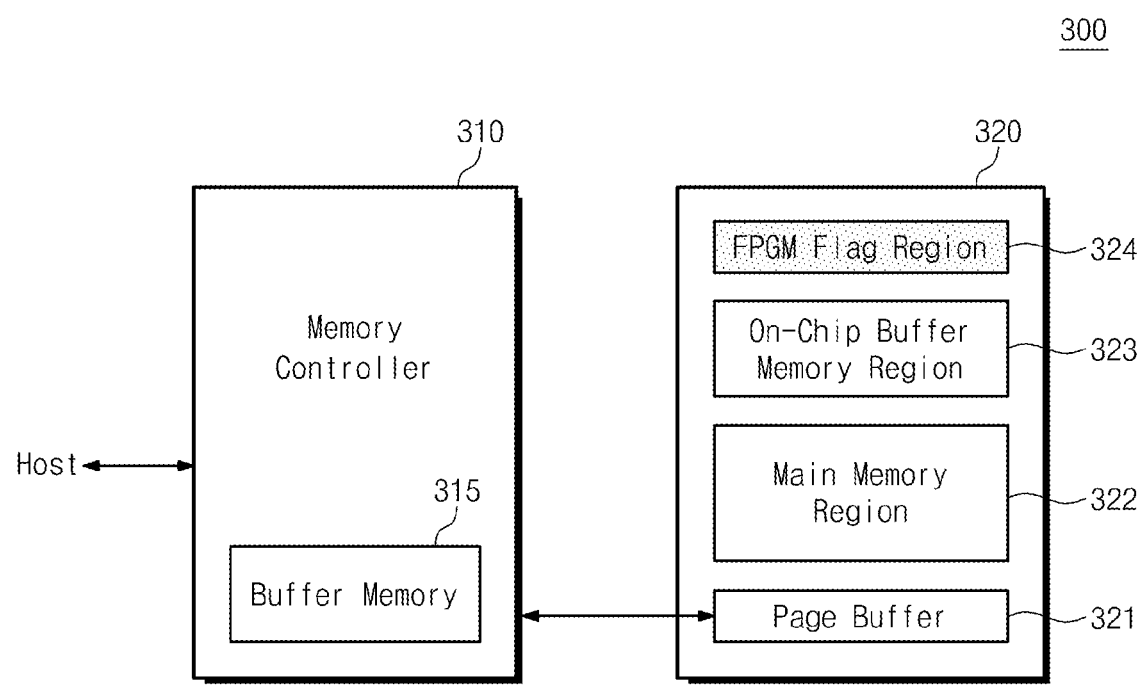
FIG. 9 is a block diagram illustrating a memory system according to an embodiment of the inventive concept.

FIG. 9 is a block diagram illustrating a memory system 300 according to an embodiment of the inventive concept.

Referring to FIG. 9, memory system 300 comprises a memory controller 310 and a nonvolatile memory device 320. A fine program flag FPGM is stored in a fine program flag region 324 within nonvolatile memory device 320.

Memory controller 310 is configured to control nonvolatile memory device 320 in response to a request from a host. Memory controller 310 comprises a buffer memory 315. A fine program flag FPGM is stored in fine program flag region 324 of nonvolatile memory device 320. In a program operation, memory controller 310 stores fine program flag FPGM in buffer memory 315 to indicate whether fine programming has been performed on word line units of memory cells. After a program operation is executed, memory controller 310 updates fine program flag region 324 with fine program flag FPGM stored in buffer memory 315.

In response to a read request, memory controller 310 reads a fine program flag FPGM of an address corresponding to the read request from fine program flag region 324. Memory controller 310 determines whether fine programming of a read requested memory region has been performed based on the read fine program flag FPGM. Where fine programming has not been performed on a read requested memory region, memory controller 310 accesses an on-chip buffer memory region 323. Where fine programming of a read requested memory region has been performed, memory controller 310 accesses main memory region 322.

Fine program flag region 324 is formed of a memory region that is capable of being accessed with relatively high speed. For example, fine program flag region 324 may be implemented using an SLC region in which single-bit data is stored in one memory cell. As described above, memory controllers 210 and 310 in FIGS. 8 and 9 may control program operations of nonvolatile memory devices 220 and 320 using static scheduling.

Figure 10:
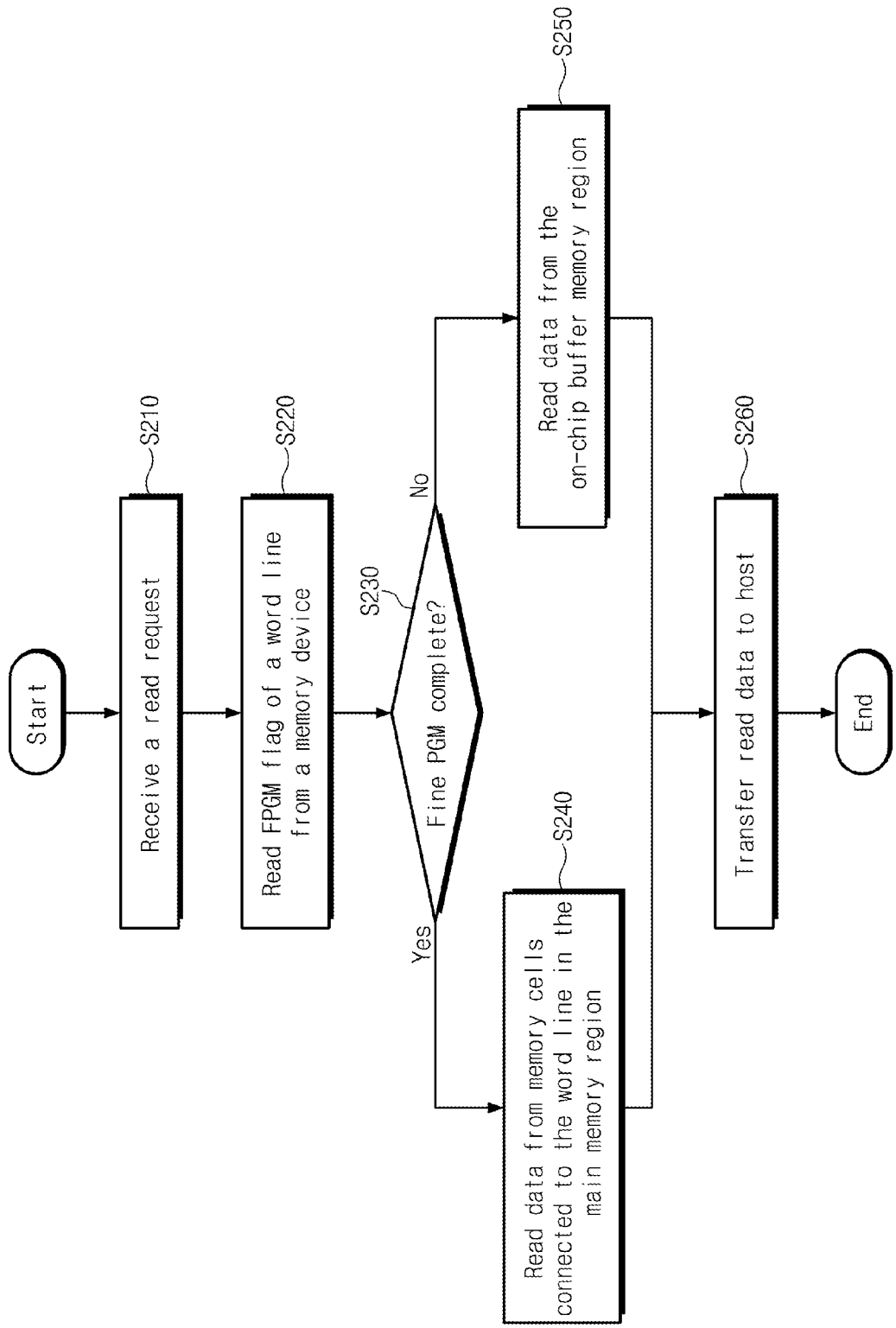
FIG. 10 is a flowchart illustrating a read method of a memory system illustrated in FIG. 8 or 9 according to an embodiment of the inventive concept.

FIG. 10 is a flowchart illustrating a read method of a memory system illustrated in FIG. 8 or 9. The method comprises operations S210 through S260 and it is described with reference to memory systems 200 and 300 of FIGS. 8 and 9 for the sake of convenience.

In operation S210, memory controller 210/310 receives a read request from an external source, such as a host. In operation S220, memory controller 210/310 detects a fine program flag corresponding to the read request. Memory controller 210/310 checks fine programming of memory cells in which read-requested data is stored based on a fine program flag stored in buffer memory 215/315. Where a fine program flag corresponding to the read request is not stored in buffer memory 215/315, memory controller 210/310 reads a fine program flag from a nonvolatile memory device 220/320.

In operation S230, memory controller 110 determines whether a fine program operation of each word line is completed, based on address mapping information. Where the read requested data is determined to be associated with a fine programming completed word line (S230=Yes), the method proceeds to operation S240. Otherwise, if the read requested is determined not to be associated with a fine programming completed word line (S230=No), the method proceeds to operation S250.

In operation S240, memory controller 210/310 controls nonvolatile memory device 220/320 such that read requested data is read out from a main memory region 222/322. A read operation of main memory region 222/322 is an MLC read operation. Data read out from main memory region 222/322 is temporarily stored in buffer memory 215/315 of memory controller 210/310. Thereafter, the method proceeds to operation S260.

In operation S250, if the read requested is determined not to be associated with a fine programming completed word line, memory controller 210/310 controls nonvolatile memory device 220/320 such that read requested data is read out from an on-chip buffer memory region 223/323. A read operation on the on-chip buffer memory region 223/323 may be an SLC read operation. Data read out from the on-chip buffer memory region 223/323 is temporarily stored in buffer memory 215/315 of memory controller 210/310. Thereafter, the method proceeds to operation S260, in which read data stored in buffer memory 215/315 is sent to the host.

Figure 11:
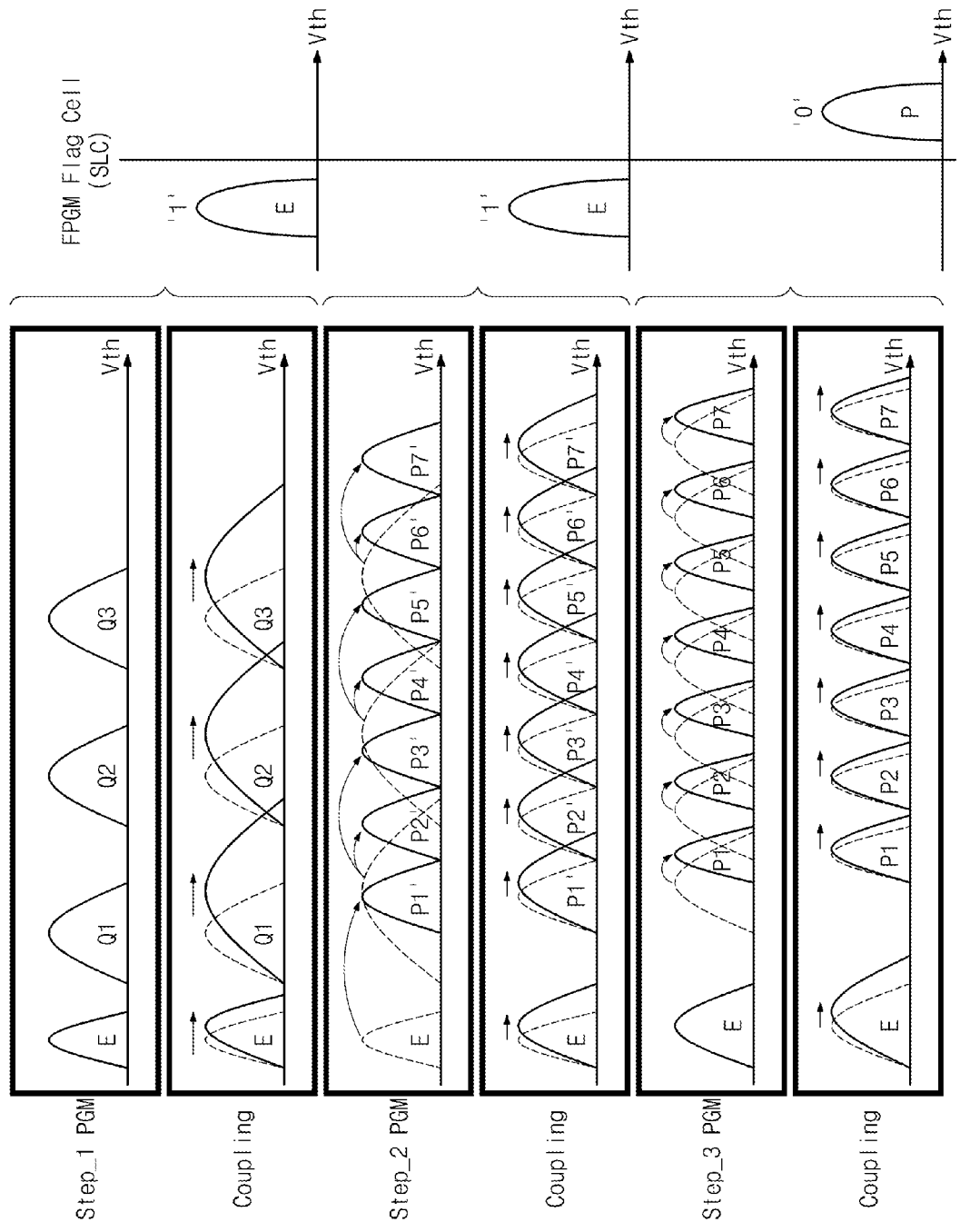
FIG. 11 is a diagram for describing a programming operation for memory cells storing fine program flags according to an embodiment of the inventive concept.

FIG. 11 is a diagram for describing a programming operation of memory cells in which fine program flags are stored. FIG. 11 shows variations of threshold voltage distributions in a program operation performed according to 3-step programming to store 3-bit data in each main memory cell. Single-bit data is stored in a fine program flag area as a fine program flag FPGM.

Referring to FIG. 11, a first step program operation is performed to store 2-page data (i.e., first and second page data) in memory cells connected to a selected word line. At this time, memory cells in a threshold voltage distribution corresponding to an erase state E are programmed to have threshold voltages in threshold voltage distributions each corresponding to program states Q1, Q2, and Q3, based on data to be programmed. A memory cell storing a fine program flag FPGM maintains an erase state E or logical '1', with the first step program operation ended.

Thereafter, 1-page data (i.e., third page data) is stored in memory cells connected to the selected word line. That is, a second step program operation is performed on the selected memory cells. At this time, memory cells in a threshold voltage distribution corresponding to a previous state may be programmed to threshold voltage distributions based on data to be programmed. For example, memory cells in a threshold voltage distribution corresponding to an erase state E may be programmed to threshold voltage distributions corresponding to a program state P1' based on data to be programmed.

Memory cells in a threshold voltage distribution corresponding to a program state Q1 may be programmed to threshold voltage distributions corresponding to program states P2' and P3' based on data to be programmed. Memory cells in a threshold voltage distribution corresponding to a program state Q2 may be programmed to threshold voltage distributions corresponding to program states P4' and P5' based on data to be programmed. Memory cells in a threshold voltage distribution corresponding to a program state Q3 may be programmed to threshold voltage distributions corresponding to program states P6' and P7' based on data to be programmed. Although the second step program operation is completed, fine programming may not be yet performed. Thus, a memory cell storing fine program flag FPGM may maintain an erase state E or logical '1'.

As described above, a third step program operation of 2-step programmed memory cells in a selected word line may be executed after a first step program operation and a second step program operation on adjacent word lines (e.g., WL2 and WL1). Memory cells in the selected word line may be programmed to have final threshold voltage distributions P1 to P7. As described above, the third step program operation may rely on previously programmed data (e.g., first to third page data). For instance, the third step program operation may be performed based on program data provided from an on-chip buffer memory region 123/223/323.

Upon completion of the third step program operation (i.e., a fine program operation), a memory cell storing a fine program flag FPGM is programmed to a program state P or logical '0'. The first step and second step programming are referred to as coarse programming in which programming may be accompanied by distribution expansion. On the other hand, the third step programming is referred to fine programming, which is performed to manage a distribution of memory cells with greater precision. Program voltages (e.g., increment ΔV) or verification voltages used in the coarse programming and the fine programming may be different.

Figure 12:
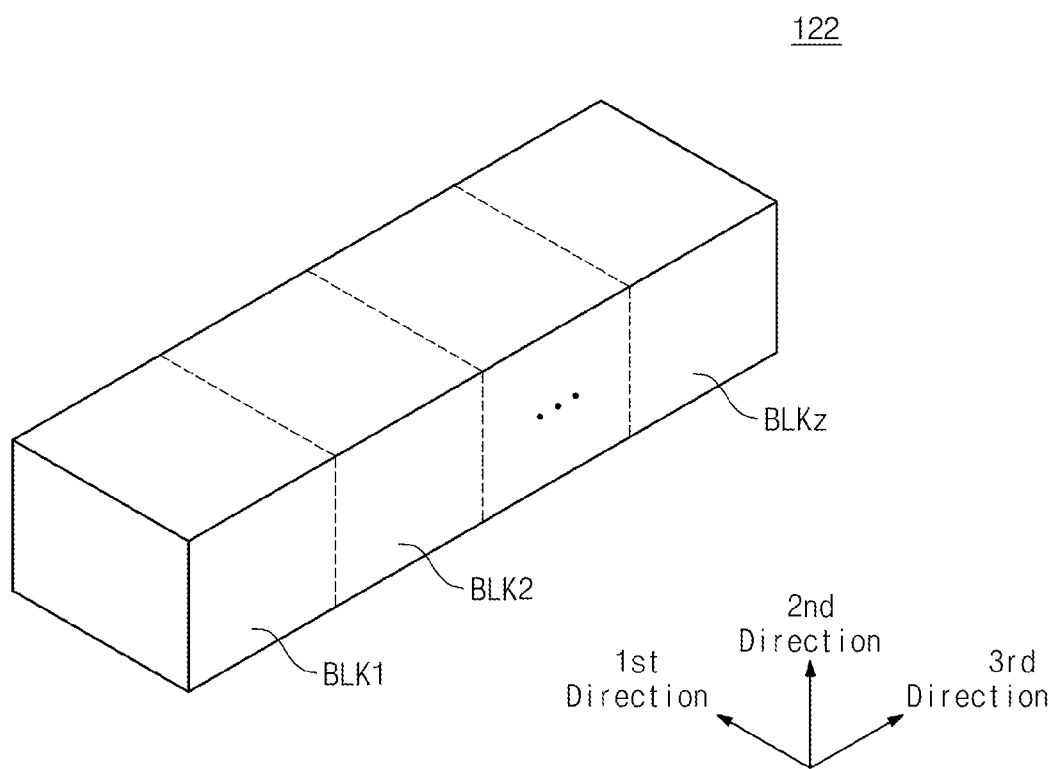
FIG. 12 is a block diagram illustrating a main memory region in FIG. 3 according to an embodiment of the inventive concept.

FIG. 12 is a block diagram illustrating an example of main memory region 122 of FIG. 3 according to an embodiment of the inventive concept.

Referring to FIG. 12, main memory region 122 comprises a plurality of memory blocks BLK1 to BLKz. Alternatively, memory blocks BLK1 to BLKz may correspond to main memory regions 222 and 322 in FIGS. 8 and 9. Each of memory blocks BLK1 to BLKz is formed with a three-dimensional structure (or, a vertical structure). For example, each of memory blocks BLK1 to BLKz may comprise structures extending along first to third directions x, y, and z. Each of memory blocks BLK1 to BLKz comprises a plurality of NAND cell strings extending along the third direction z. On-chip buffer memory region 123 may also have the same structure as main memory region 122.

Each NAND cell string is coupled with a bit line BL, a string selection line SSL, a plurality of word lines WL, a ground selection line GSL, and a common source line CSL. That is, each memory block may be connected with a plurality of bit lines BL, a plurality of string selection lines SSL, a plurality of ground selection lines GSL, a plurality of word lines WL, and a common source line CSL. Memory blocks BLK1 to BLKz are described in further detail with reference to FIGS. 13 and 14.

Figure 13:
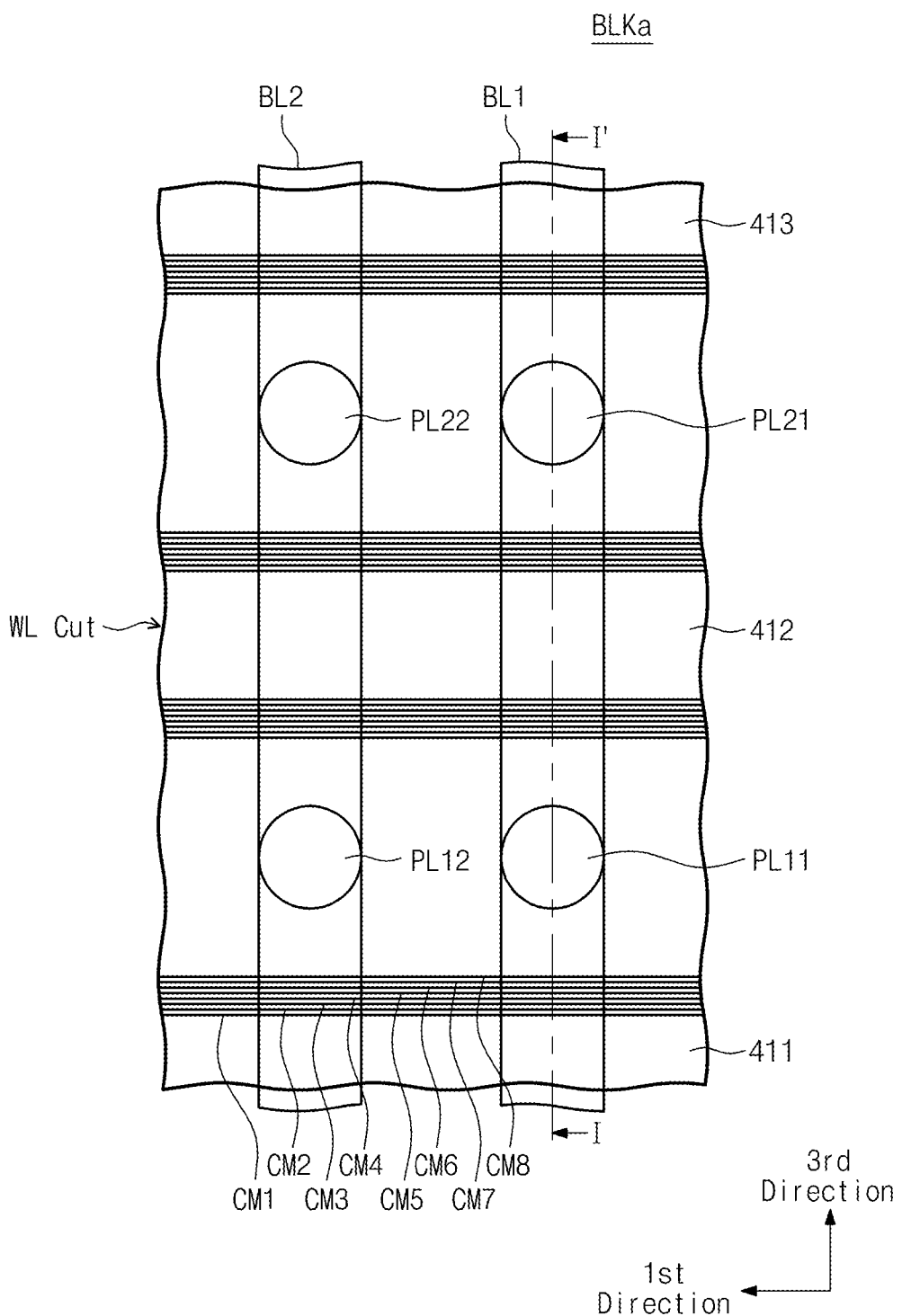
FIG. 13 is a perspective view of one of memory blocks in FIG. 12 according to an embodiment of the inventive concept.
Figure 14:
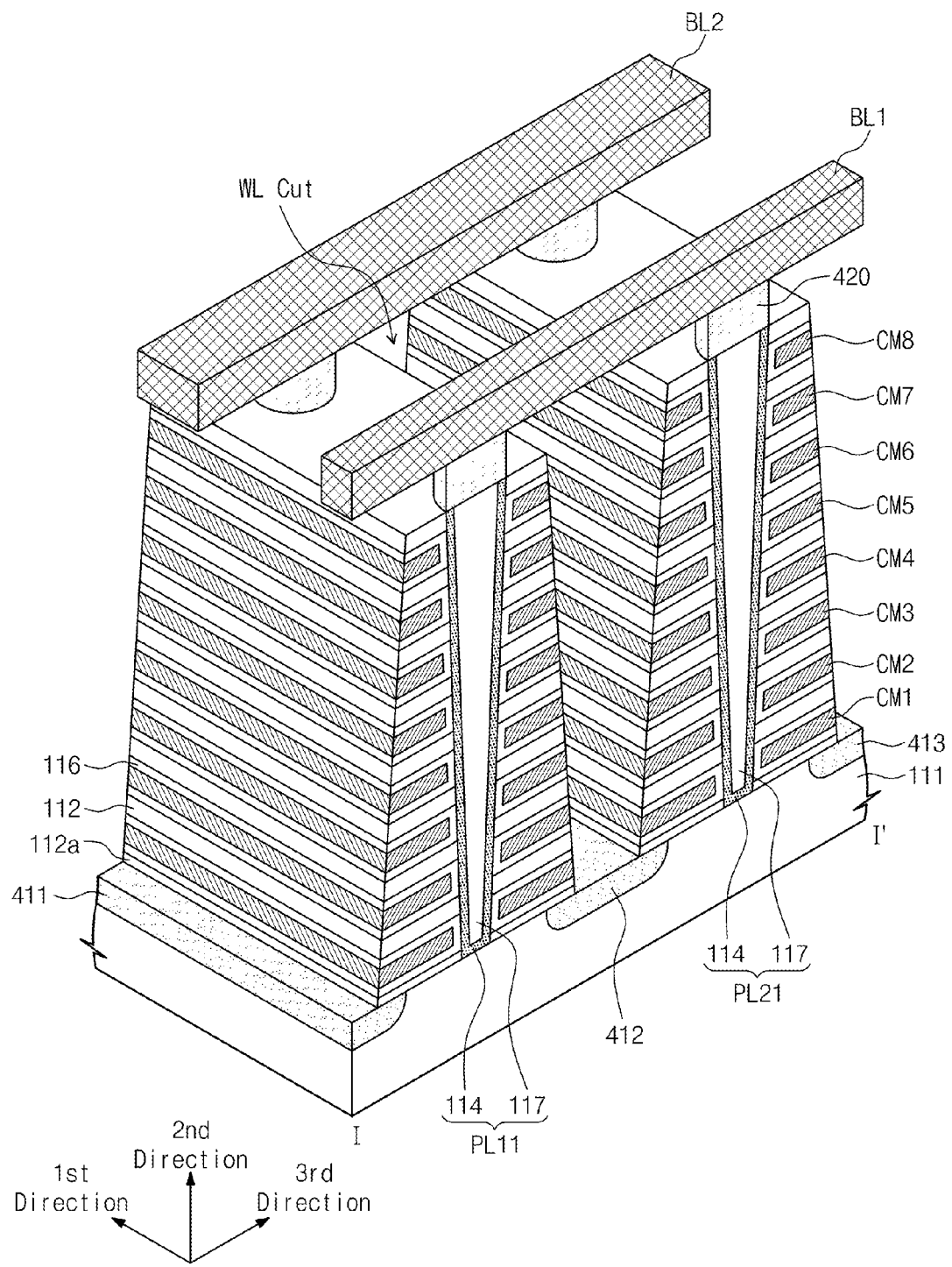
FIG. 14 is a cross-sectional view taken along a line I-I' in FIG. 13.

FIG. 13 is a perspective view of one of memory blocks BLK1 to BLKz in FIG. 12. FIG. 14 is a cross-sectional view taken along a line I-I' in FIG. 13.

Referring to FIGS. 13 and 14, a memory block BLKa comprises structures extending along first to third directions.

Memory block BLKa comprises a substrate 111, which may be a well having a first conductivity type, for example. Substrate 111 may be a p-well in which a Group III element such as boron is injected. Substrate 111 may be a pocket p-well which is provided within an n-well. In the description that follows, it is assumed that substrate 111 is a p-well (or, a pocket p-well). However, substrate 111 is not limited to p-type.

A plurality of doping regions 411 to 413 extending along a first direction are provided in substrate 111. Doping regions 411 to 413 are spaced apart from one another along a third direction. Doping regions 411 to 413 illustrated in FIGS. 13 and 14 are referred to as to a first doping region 411, a second doping region 412, and a third doping region 413, respectively.

First to third doping regions 411 to 413 have a second conductivity type different from that of substrate 111. Below, it is assumed that first to third doping regions 411 to 413 are the n-type. However, first to third doping regions 411 to 413 are not limited to the n-type.

Between two adjacent doping regions of first to third doping regions 411 to 413, a plurality of insulation materials 112 and 112a are provided on substrate 111 sequentially along a second direction (i.e., a direction perpendicular to substrate 111). Insulation materials 112 and 112a are spaced apart along the second direction. Insulation materials 112 and 112a extend along the first direction. For example, insulation materials 112 and 112a comprises an insulation material such as a silicon oxide film. A thickness of insulation material 112a contacting with substrate 111 is thinner than that of insulation material 112.

Between two adjacent doping regions of the first to third doping regions 411 to 413, a plurality of pillars PL11, PL12, PL21, and PL22 are arranged sequentially along the first direction to penetrate insulation materials 112 and 112a along the second direction. In some embodiments, pillars PL11, PL12, PL21, and PL22 contact substrate 111 via insulation materials 112.

Each of pillars PL11, PL12, PL21, and PL22 is formed of multiple layers. In particular, each of pillars PL11, PL12, PL21, and PL22 comprises a channel film 114 and an inner material 117. In each of pillars PL11, PL12, PL21, and PL22, a channel film may be formed to surround an inner material.

Channel films 114 comprise a semiconductor material (e.g., silicon) having the first conductivity type. For example, channel films 114 may comprise a semiconductor material (e.g., silicon) having the same type as substrate 111. Below, it is assumed that channel films 114 include p-type silicon. However, channel films 114 are not limited to the p-type silicon. For example, channel films 114 may include intrinsic semiconductor, which is a nonconductor.

Inner materials 117 comprise an insulation material. For example, inner materials 117 comprise an insulation material such as silicon oxide. Alternatively, inner materials 117 may comprise an air gap.

Between two adjacent doping regions of first to third doping regions 411 to 413, information storage films 116 are provided on exposed surfaces of insulation materials 112 and 112a and pillars PL11, PL12, PL21, and PL22. In some embodiments, a thickness of information storage film 116 is less than a distance between insulation films 112 and 112a.

Between two adjacent doping regions of the first to third doping regions 411 to 413, conductive materials CM1 to CM8 may be provided on exposed surfaces of information storage films 116. In further detail, conductive materials CM1 to CM8 extending along the first direction may be provided between an information storage film, provided on a lower surface of an upper one of insulation materials 112 and 112a, and an information storage film provided on an upper surface of a lower one of insulation materials 112 and 112a.

Conductive materials CM1 to CM8 and insulation materials 112 and 112a on doping regions 411 to 413 may be separated by a word line cut WL cut. Conductive materials CM1 to CM8 comprise a metallic conductive material. Conductive materials CM1 to CM8 can include a nonmetallic conductive material such as polysilicon.

In some embodiments, an information storage film is removed which is provided on an upper surface of an insulation material, placed at the uppermost layer, from among insulation materials 112 and 112a. In some embodiments, an information storage film is provided at one, opposite to pillars PL11, PL12, PL21, and PL22, from among sides of insulation materials 112 and 112a.

A plurality of drains 420 are provided on respective pillars PL11, PL12, PL21, and PL22. Drains 420 may comprise a semiconductor material (e.g., silicon) having the second conductivity type. For example, drains 420 may comprise an n-type semiconductor material. In the description that follows, it is assumed that drains 320 include n-type silicon. However, the described embodiments are not limited to this type of material. In some embodiments, drains 420 extend toward upper portions of channel films 114 of pillars PL11, PL12, PL21, and PL22.

Bit lines BL1 and BL2, which extend in the third direction, are provided on drains 420 so as to be spaced apart from one another along the first direction. Bit lines BL1 and BL2 are coupled with drains 420. In some embodiments, drains 420 and bit lines BL1 and BL2 are connected via contact plugs (not shown). Bit lines BL1 and BL2 comprise a metallic conductive material. Alternatively, bit lines BL1 and BL2 comprise a nonmetallic conductive material such as polysilicon.

Below, rows and columns of pillars PL11, PL12, PL21, and PL22 of a memory block BLKa are defined. Rows of pillars PL11, PL12, PL21, and PL22 are defined according to whether conductive materials CM1 to CM8 are separated or not. In FIGS. 13 to 14, conductive materials CM1 to CM8 are separated on the basis of second doping region 412.

Pillars PL11 and PL12, which are coupled with conductive materials CM1 to CM8 between first doping region 411 and second doping region 412 via information storage films 116, are defined as a first row of pillars. Pillars PL21 and PL22, which are coupled with conductive materials CM1 to CM8 between second doping region 412 and third doping region 413 via information storage films 116, are defined as a second row of pillars.

Columns of pillars PL11, PL12, PL21, and PL22 can be defined according to bit lines BL1 and BL2. More specifically, pillars PL11 and PL21 connected with bit line BL1 via drains 420 may be defined as a first column of pillars. Pillars PL12 and PL22 connected with bit line BL2 via drains 420 may be defined as a second column of pillars.

Below, heights of conductive materials CM1 to CM8 may be defined. Conductive materials CM1 to CM8 may have first to eighth heights according to a distance from substrate 111. Conductive material CM1 closest to substrate 111 may have a first height, and conductive material CM8 closest to bit lines BL1 and BL2 may have an eighth height.

Each of pillars PL11, PL12, PL21, and PL22 constitutes a cell string with an adjacent information storage film 116 and an adjacent conductive material CMj (j=1 to 8). That is, pillars PL11, PL12, PL21, and PL22 form cell strings in conjunction with information storage films 116 and conductive materials CM1 to CM8.

Figure 15:
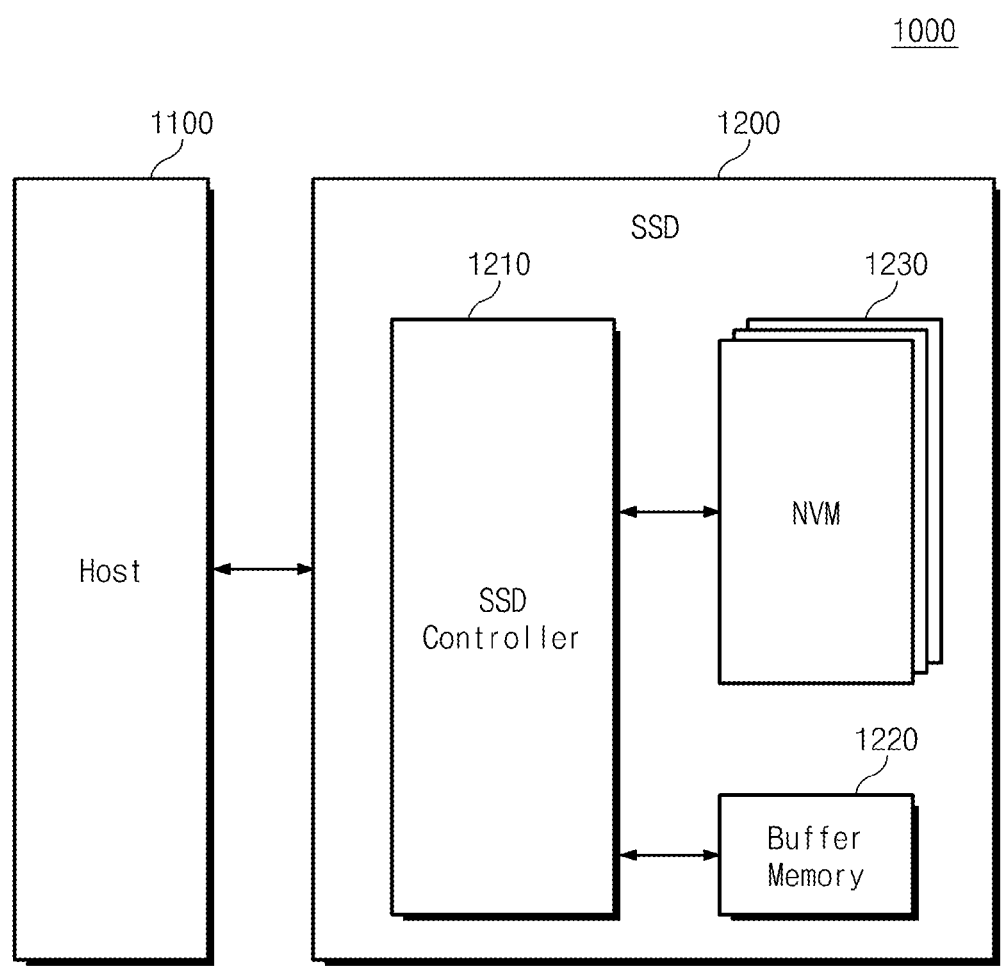
FIG. 15 is a block diagram illustrating an electronic device comprising a solid state disk according to an embodiment of the inventive concept.

FIG. 15 is a block diagram illustrating an electronic device 1000 comprising a solid state disk according to an embodiment of the inventive concept.

Referring to FIG. 15, an electronic device 1000 comprises a host 1100 and an SSD 1200. SSD 1200 comprises an SSD controller 1210, a buffer memory 1220, and a nonvolatile memory device 1230.

SSD controller 1210 provides physical interconnection between host 1100 and SSD 1200. SSD controller 1210 provides an interface with SSD 1200 corresponding to a bus format of host 1100. In particular, SSD controller 1210 decodes a command provided from host 1100. SSD controller 1210 accesses nonvolatile memory device 1230 according to a result of the decoding. The bus format of host 1100 can be, for example, Universal Serial Bus (USB), Small Computer System Interface (SCSI), peripheral component interconnect (PCI) Express, Advanced Technology Attachment (ATA), Parallel ATA (PATA), Serial ATA (SATA), or Serial Attached SCSI (SAS).

Buffer memory 1220 temporarily stores write data provided from host 1100 or data read out from nonvolatile memory device 1230. In the event that data stored in nonvolatile memory device 1230 is cached when a read request is received from host 1100, buffer memory 1220 supports a cache function to provide cached data directly to host 1100. A data transfer speed of a bus format (e.g., SATA or SAS) of host 1100 may be higher than that of a memory channel of SSD 1200. Accordingly, where an interface speed of host 1100 is remarkably fast, lowering of the performance due to a speed difference may be reduced through the use of buffer memory 1220 having a large storage capacity.

Buffer memory 1220 can be formed of a synchronous DRAM to provide sufficient buffering to SSD 1200 used as an auxiliary mass storage device. However, buffer memory 1220 is not limited to a synchronous DRAM or any other specific type of memory.

Nonvolatile memory device 1230 can be provided as a storage medium of SSD 1200. For example, nonvolatile memory device 1230 can be formed of a NAND flash memory device providing mass storage capacity. Moreover, nonvolatile memory device 1230 can be formed of a plurality of memory devices. In this case, memory devices may be connected with SSD controller 1210 by a channel unit. Nonvolatile memory device 1230 is not limited to a NAND flash memory device. For example, it can alternatively be formed of a PRAM, an MRAM, a ReRAM, a FRAM, a NOR flash memory, or various other types of nonvolatile memory. In addition, the inventive concept may be applied to a memory system that uses different types of memory devices in combination.

Nonvolatile memory device 1230 comprises an on-chip buffer memory region for a buffer program operation and a main memory region for a main program operation. In a main program operation, memory cells in the main memory region are programmed by coarse programming and fine programming. Fine program flag PFGM flag indicating whether the fine programming is ended is stored and updated at nonvolatile memory device 1230 or SSD controller 1210. Upon generation of a read request, SSD controller 1210 accesses the on-chip buffer memory region or the main memory region, based on fine program flag FPGM indicating whether the fine programming is ended.

Figure 16:
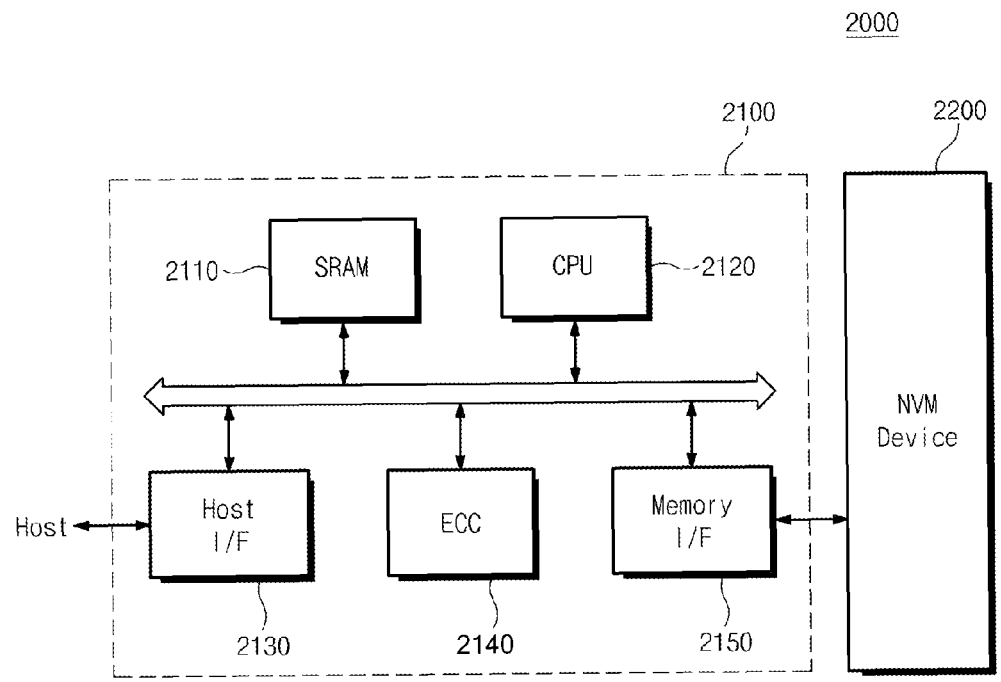
FIG. 16 is a block diagram illustrating an electronic device according to an embodiment of the inventive concept.

FIG. 16 is a block diagram illustrating an electronic device 2000 according to an embodiment of the inventive concept.

Referring to FIG. 16, electronic device 2000 comprises a memory controller 2100 and a nonvolatile memory device 2200. Nonvolatile memory device 2200 can be implemented similar to nonvolatile memory device 120 of FIG. 3.

Memory controller 2100 is configured to control nonvolatile memory device 2200. An SRAM 2110 is used as a working memory. A host interface 2130 implements a data exchange protocol of a host connected with electronic device 2000. An ECC circuit 2140 is configured to detect and correct an error of data read out from nonvolatile memory device 2200. A memory interface 2150 is configured to interface with nonvolatile memory device 2200. A CPU 2120 is configured to control operations for exchanging data. Although not shown, data storage device 2000 further comprises a ROM that stores code data for interfacing with a host.

Memory controller 2100 is configured to communicate with an external device (e.g., a host) via one of various interface protocols, such as USB, MMC, PCI-E, SAS, SATA, PATA, SCSI, ESDI, or IDE, for example.

Electronic device 2000 can be incorporated in various types of systems, such as a computer, a portable computer, an Ultra Mobile PC (UMPC), a workstation, a net-book, a PDA, a web tablet, a wireless phone, a mobile phone, a smart phone, an e-reader, a portable multimedia player (PMP), a digital camera, a digital audio recorder/player, a digital picture/video recorder/player, a portable game machine, a navigation system, a black box, a 3-dimensional television, a device capable of transmitting and receiving information in a wireless network, one of various electronic devices constituting home network, one of various electronic devices constituting computer network, one of various electronic devices constituting telematics network, RFID, or one of various electronic devices constituting a home network.

Nonvolatile memory device 2200 comprises an on-chip buffer memory region for a buffer program operation and a main memory region for a main program operation. In the main program operation, memory cells in the main memory region are programmed by coarse programming and fine programming. Fine program flag PFGM, which indicates whether the fine programming is ended, is stored and updated at nonvolatile memory device 2200 or memory controller 2100. Upon generation of a read request, memory controller 2100 accesses the on-chip buffer memory region or the main memory region of nonvolatile memory device 2200 based on fine program flag FPGM.

Figure 17:
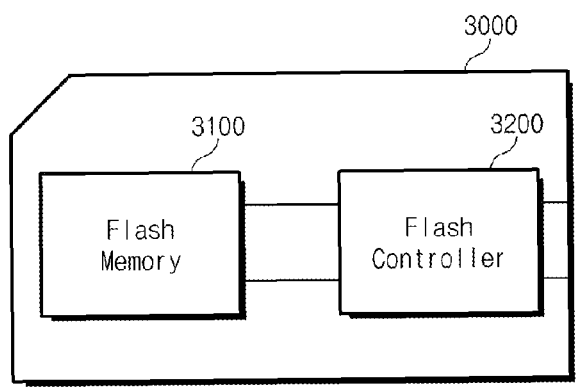
FIG. 17 is a block diagram illustrating a data storage device according to an embodiment of the inventive concept.

FIG. 17 is a block diagram illustrating a data storage device 3000 according to an embodiment of the inventive concept.

Referring to FIG. 17, data storage device 3000 comprises a flash memory 3100 and a flash controller 3200. Flash controller 3200 controls flash memory 3100 in response to control signals received from the outside of data storage device 3000.

Flash memory 3100 may be configured the same as nonvolatile memory devices shown in FIG. 3, 8, or 9. Flash memory 3100 is generally configured to have one of a stack flash structure having arrays stacked in multi-layer, a source-drain free flash structure, a pin-type flash structure, and a three-dimensional flash structure.

Data storage device 3000 can take various forms, such as a memory card device, an SSD device, a multimedia card device, an SD device, a memory stick device, a HDD device, a hybrid drive device, or a USB flash device, for example. In some embodiments, data storage device 3000 is a card satisfying an industrial standard for an electronic device such as a digital camera or a personal computer.

Flash memory 3100 comprises an on-chip buffer memory region for a buffer program operation and a main memory region for a main program operation. In a main program operation, memory cells in the main memory region are programmed by coarse programming and fine programming. Fine program flag PFGM, which indicates whether the fine programming is ended, is stored and updated at flash memory 3100 or flash controller 3200. Upon generation of a read request, flash controller 3200 accesses the on-chip buffer memory region or the main memory region of flash memory 3100 based on fine program flag FPGM indicating whether the fine programming is ended.

Figure 18:
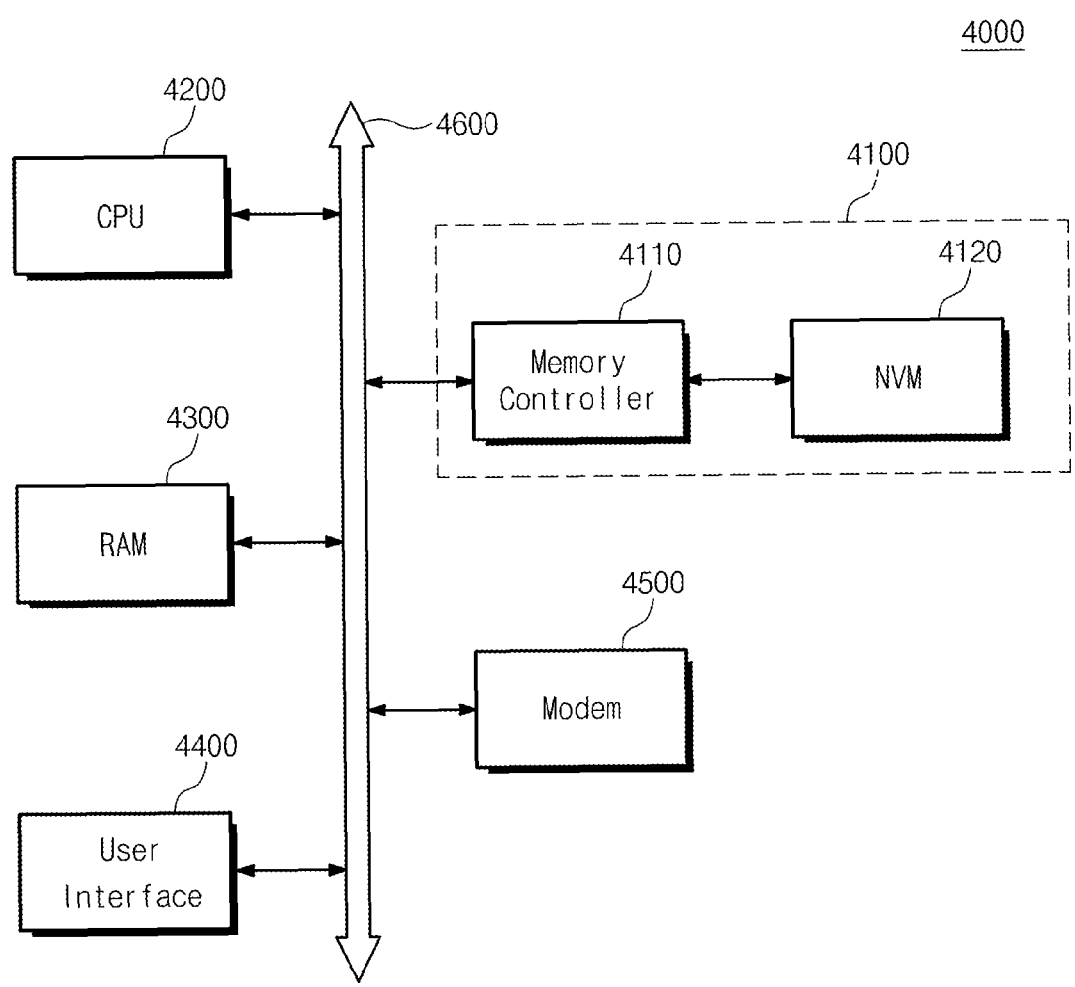
FIG. 18 is a block diagram illustrating a computing system comprising a flash memory device according to an embodiment of the inventive concept.

FIG. 18 is a block diagram illustrating a computing system 4000 comprising a flash memory device according to an embodiment of the inventive concept.

Referring to FIG. 18, computing system 4000 comprises a flash memory device 4100 having a memory controller and a nonvolatile memory device (NVM) 4120, a modem 4500 such as a baseband chipset, a microprocessor 4200, a RAM 4300, and a user interface 4400. These features are electrically connected to each other by a bus 4600.

NVM 4120 can be configured with memory blocks similar to that illustrated in FIG. 3. Moreover, NVM 4120 may be configured to have one of a stack flash structure having arrays stacked in multi-layer, a source-drain free flash structure, a pin-type flash structure, and a three-dimensional flash structure.

Where computing system 4000 is a mobile device, it typically further comprises a battery (not shown). Although not shown, computing system 4000 may further comprise other common features such as an application chipset, a camera image processor (CIS), or a mobile DRAM, for example. Memory controller 4100 and NVM 4120 may form an SSD to store data, for example.

Flash memory 4100 comprises an on-chip buffer memory region for a buffer program operation and a main memory region for a main program operation. In the main program operation, memory cells in the main memory region are programmed by coarse programming and fine programming. Fine program flag PFGM, which indicates whether the fine programming is ended, is stored and updated at NVM 4120 or memory controller 4110.

Upon generation of a read request, memory controller 4110 accesses the on-chip buffer memory region or the main memory region of NVM 4120, based on fine program flag FPGM indicating whether the fine programming is ended.

In various embodiments, a nonvolatile memory device and/or a memory controller may be packaged in various types of packages or package configurations, such as, e.g., Package on Package (PoP), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A memory system, comprising:
  a nonvolatile memory device comprising a memory cell array having a first memory region and a second memory region, wherein the nonvolatile memory device transfers data in the first memory region to the second memory region using a coarse program operation or a fine program operation in response to a write command; and
  a memory controller supplying the write command to the nonvolatile memory device, and further configured to control the nonvolatile memory device in response to a read request to read the data from the first memory region or the second memory region based on a fine program flag indicating whether the fine program operation is completed,
  wherein the fine program flag is stored in a lookup table and indicates whether the fine program operation has been completed with respect to a memory block unit and a word line unit of the second memory region.

2. The memory system of claim 1, wherein the lookup table is stored in a buffer memory of the memory controller.

3. The memory system of claim 2, wherein the fine program flag comprises a code indicating a location of memory cells connected to a word line for which the fine program operation has been completed.

4. The memory system of claim 1, wherein the fine program flag is updated periodically in a specific memory region of the nonvolatile memory device.

5. The memory system of claim 1, wherein the lookup table is stored in a spare region of the nonvolatile memory device in which control information of the second memory region is stored.

6. The memory system of claim 5, wherein the fine program flag is programmed in the spare region using a single-level cell (SLC) programming method.

7. The memory system of claim 1, wherein the memory controller is configured to control the nonvolatile memory device to access the first memory region where the fine program flag indicates that the fine program operation is not completed.

8. The memory system of claim 1, wherein the lookup table is stored in a third memory region of the nonvolatile memory device.

9. The memory system of claim 1, wherein the data is written in the first memory region using a single-level cell (SLC) programming method and the data is written in the second memory region using a multi-level cell (MLC) programming method.

10. A method of operating a nonvolatile memory device comprising a first memory region and a second memory region and configured to write data in the second memory region using a coarse program operation and a fine program operation, the method comprising:
storing a fine program flag indicating whether the fine program operation has been completed with respect to a memory block and a word line unit of the second memory region;
receiving a read request;
reading a stored fine program flag indicating whether fine programming has been completed in the second region with respect to read data corresponding to the read request; and
accessing read data from either the first memory region or the second memory region according to the read fine program flag.

11. The method of claim 10, further comprising:
storing data in the first memory region via a buffer program operation; and
programming the data written in the first memory region into the second memory region using the coarse and fine program operations.

12. The method of claim 11, wherein the fine program flag is stored after completion of the fine programming.

13. The method of claim 10, wherein the fine program flag is stored in a memory region external to the nonvolatile memory device.

14. A method of operating a nonvolatile memory device comprising a first memory region and a second memory region, comprising:
storing program data in the first memory region;
performing coarse programming and fine programming to store the program data in the second memory region;
storing a fine program flag indicating whether the fine programming has been completed with respect to a memory block and a word line unit of the second memory region; and
in response to a read request, accessing the program data from the first memory region or the second memory region according to a stored fine program flag indicating whether the fine programming has been completed.

15. The method of claim 14, wherein the fine program flag is stored in a buffer memory of a memory controller.

16. The method of claim 14, wherein the first memory region is an on-chip buffer memory region and the second region is a main memory region.

17. The method of claim 14, wherein the program data is stored in the first memory region using a single-level cell (SLC) programming method and the program data is stored in the second memory region using a multi-level cell (MLC) programming method.

18. The method of claim 14, further comprising performing the coarse programming and the fine programming using an address scramble method.

* * * * *